United States Patent [19]

Deveaud-Pledran

[11] Patent Number: 5,283,688
[45] Date of Patent: Feb. 1, 1994

[54] OPTICAL AMPLIFIER HAVING A SEMICONDUCTOR WITH A SHORT SWITCHING TIME

[75] Inventor: Benoit Deveaud-Pledran, Lannion, France

[73] Assignee: France Telecom Etablissement Autonome De Droit Public, Paris, France

[21] Appl. No.: 9,138

[22] Filed: Jan. 26, 1993

[30] Foreign Application Priority Data

Jan. 31, 1992 [FR] France ................. 92 01083

[51] Int. Cl.⁵ .............. H01S 3/25; H01S 3/19; C02F 3/00
[52] U.S. Cl. ..................... 359/344; 372/45; 257/431
[58] Field of Search ............ 359/344; 357/17, 30; 372/45

[56] References Cited

U.S. PATENT DOCUMENTS

| 4,745,452 | 5/1988 | Sollner ............... 356/16 X |
| 4,941,025 | 7/1990 | Tabatabaie ............ 357/16 |
| 5,151,818 | 9/1992 | Thijs et al. .......... 359/344 |

FOREIGN PATENT DOCUMENTS 0280281 8/1988 European Pat. Off. .
0390167 10/1990 European Pat. Off. .

OTHER PUBLICATIONS

Hara et al, "Assymmetric dual quantam well laser-wavelength switching controlled by injection current", Appl. Phys. Lett 55 (12) Sep. 1989.

Ikeda et al, "Evidence of the wavelength switching caused by a blocked carrier transport in an asymmetric dual quantum well laser", Appl. Physics Letters, Jul. 1991.

Primary Examiner—Mark Hellner
Attorney, Agent, or Firm—Oblon, Spivak, McClelland, Maier & Neustadt

[57] ABSTRACT

The amplifier according to the invention comprises a shallow, narrow well (P1) in which amplification takes place and a deep, wide well (P2) for collecting the carriers at the end of excitation, said well being emptied by the laser effect.

Application to optical telecommunications.

10 Claims, 3 Drawing Sheets

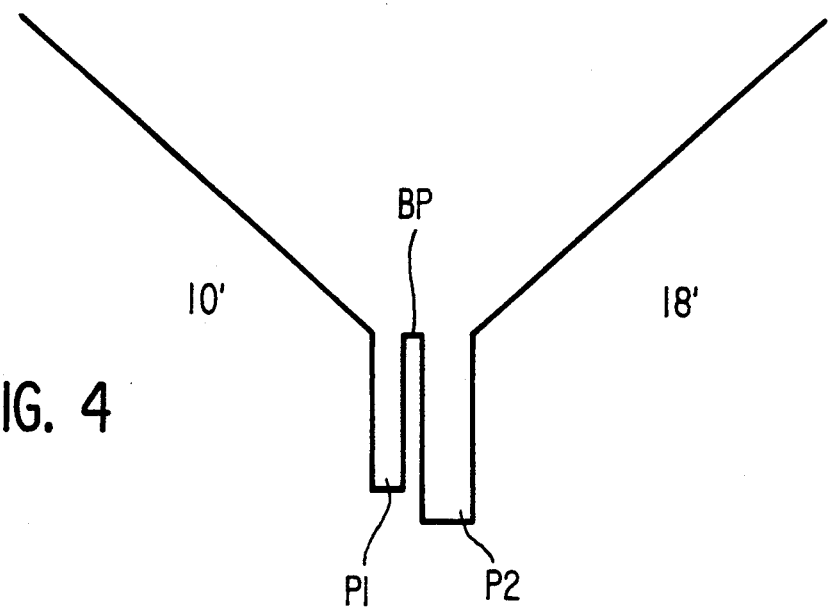
FIG. 4
FIG. 5(a)
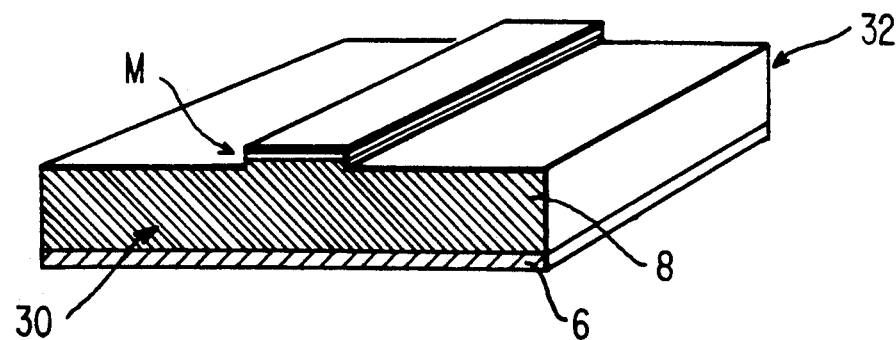
FIG. 5(b)
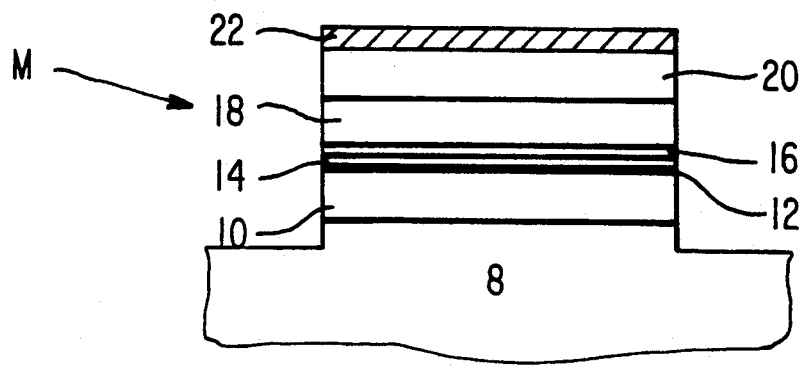

OPTICAL AMPLIFIER HAVING A SEMICONDUCTOR WITH A SHORT SWITCHING TIME

TECHNICAL FIELD

The present invention relates to an optical amplifier having a semiconductor with a short switching time. It is used in optical telecommunications.

PRIOR ART

In order to obtain a switched optical beam, it is possible to use an oscillator laser and switch said laser. However, it is also possible to use a continuously emitting laser, amplify the continuous beam in an amplifier and switch said amplifier. Said "external" switching is easier to carry out than "internal" switching. However, it is only possible if the life of the carriers in the active states of the amplifier is sufficiently short. A solution which has been considered for reducing said life consists of irradiating the amplifier structure with electrons. However, this solution suffers from the disadvantage of destroying the quality of the semiconductor lasers and reducing the life of the system.

In order to provide a satisfactory solution to this problem, the invention uses a quantum well-type structure. Before describing the invention in detail, it is pointed out that for a number of years interest has been attached to a new class of structures referred to as quantum wells or, in a more complex variant, multiple quantum wells or MQW.

A quantum well is obtained by inserting between two thin layers of a first semiconductor material a thin layer of a second material having a smaller forbidden band than that of the first material. Therefore a potential well is created for the charge carriers in the central conductor, which has the smallest forbidden band, said well being surrounded by two potential barriers corresponding to the two lateral layers. A multiple quantum well is obtained by superimposing such structures, without there being any coupling between the wells (which is obtained by giving the barriers an adequate thickness).

Such structures can be used for producing lasers or saturatable absorbents. Thus, FR-A-2,589,630 describes a saturatable absorbent with a very short switching time. The structure used is shown in FIG. 1. The latter shows in part a) a stack of layers of two semiconductor materials $SC_1$, $SC_2$, the thickness of the layers of $SC_2$ being the same in each case, whereas the thickness of the layers of $SC_1$ is equal either to a low value $Lp_1$ or to a high value $Lp_2$. In part b) it is possible to see the energy diagram of the conduction band (the valence band is not shown, but has a similar, but symmetrical configuration). Barriers of width Lb separate wells of alternate width $Lp_1$ and $Lp_2$. In the wide wells, the lowest energy level $E_1$ is below the level $E'_1$, which is the lowest level in the narrow wells.

In such a device, the saturatable absorption is obtained in the narrow wells, whilst the wide wells are used for collecting photoexcited carriers which have been created in adjacent narrow wells.

The introduction of a widened well has the effect of creating therein one or more energy levels below the lowest energy level of the conduction band (for electrons) and above the energy level of the valence band (for holes). Therefore the carriers tend to accumulate in the wide well or wells on the low energy levels.

Although satisfactory in certain respects, times of approximately 1 picosecond being obtained, said devices give rise to a problem linked with the evacuation of the carriers from the wide well when using such a device at high repetition rates. An attempt can be made at solving this problem by emptying the wide well by laser effect. This principle has been demonstrated for saturatable absorbents (cf. the article by J. L. Oudar and J. A. Levenson, IQEC'88, Technical Digest, 626, 1988). However, it is necessary to use very high exciting powers and it only functions in a limited temperature range.

DESCRIPTION OF THE INVENTION

The present invention takes up the idea of a main well coupled across a potential barrier to an auxiliary well, the responsibility of the latter being to collect the carriers from the main well. For this reason, the second well can be referred to as a "dustbin" well, as opposed to the first well which is an "active" well. The invention uses materials such that the active well makes it possible to bring about the desired amplification at the wavelength, whereas the dustbin well contributes to the rapid emptying of the active well when electrical excitation has ended and is itself depopulated by the laser effect, without any amplification taking place across said dustbin well, which would naturally ruin the possibility of rapidly modulating the amplification at the sought wavelength.

Therefore the structure according to the invention is provided with transparent layers deposited on the lateral faces of the structure (in practise on the faces perpendicular to the plane of the layers), said layers being given a type and thickness so as to form semireflecting layers at the wavelength corresponding to the dustbin well, where the laser effect for depopulating said well takes place and for simultaneously constituting antireflection layers at the wavelength corresponding to the active well where amplification takes place.

More specifically, the present invention relates to an optical amplifier with a short switching time, characterized in that it comprises a stack of semiconductor layers incorporating:

a first layer of a first semiconductor having a first forbidden band and a first thickness, a second layer of a second semiconductor having a second forbidden band wider than the first forbidden band of the first semiconductor, said second layer having a second thickness, a third layer of a third semiconductor having a third forbidden band smaller than the first forbidden band of the first semiconductor, said third layer having a third thickness, said stack thus comprising a shallow quantum well in the first layer coupled to a deep quantum well in the third layer across a potential barrier in the second layer, said stack also being surrounded by two layers constituting antireflection layers for a wavelength corresponding to the energy of the first forbidden band of the first semiconductor constituting the shallow quantum well and partial reflection layers for a wavelength corresponding to the energy of the third forbidden band of the third semiconductor constituting the deep quantum well, the optical amplification taking place at the wavelength corresponding to the shallow well and the laser effect taking place at the wavelength corresponding to the deep well.

In general, the third thickness of the third layer is greater than the thickness of the first layer.

BRIEF DESCRIPTION OF THE DRAWINGS

FIG. 4 a variant with gradual confinement layers.

FIGS. 5a and 5b show the general structure of an amplifier according to the invention.

DETAILED DESCRIPTION OF AN EMBODIMENT

Figure 2A:
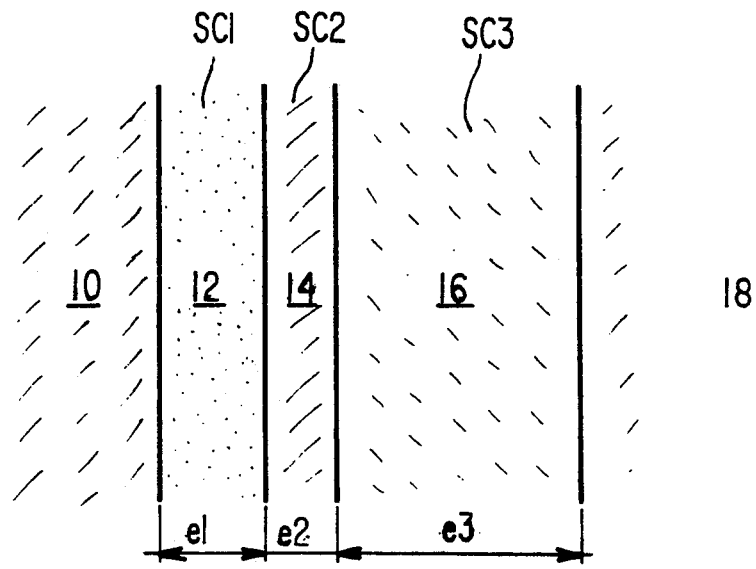
FIGS. 2a and 2b show the structure of bands of an amplifier according to the invention.
Figure 2B:
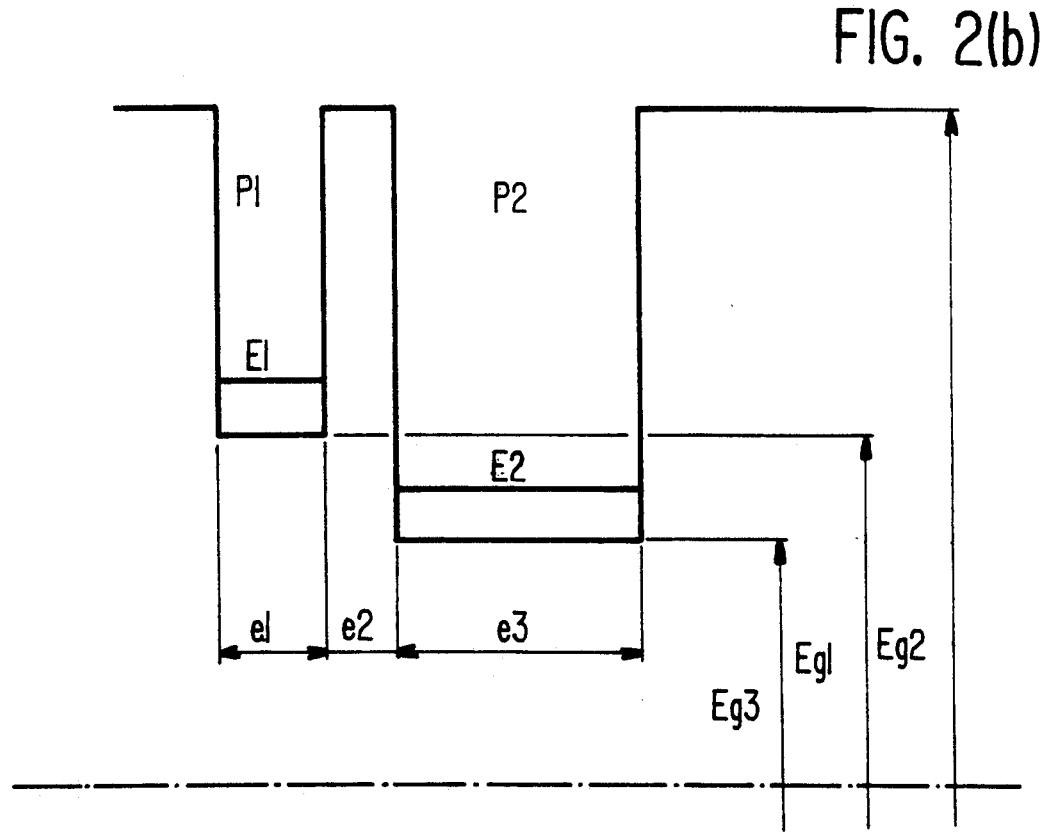

FIG. 2 shows an amplifier structure according to the invention with its different layers (part a) and energy bands (part b). This structure comprises a first layer 12 of a first semiconductor $SC_1$ having a forbidden band $Eg_1$, said first layer having a thickness $e_1$; a second layer 14 of a second semiconductor $SC_2$ having a forbidden band $Eg_2$ greater than the band $Eg_1$ of $SC_1$ and having a second thickness $e_2$; a third layer 16 of a third semiconductor $SC_3$ having a forbidden band $Eg_3$ narrower than the band $Eg_1$ of the first semiconductor, said third layer 16 having a thickness $e_3$ which, in the example illustrated, is greater than the thickness $e_1$ of the first layer 12.

This leads to the formation of a shallow, narrow quantum well P1 in the layer 12, said well being coupled to a deep, wide quantum well P2 in the layer 16 across a potential barrier BP corresponding to the layer 14.

This stack of three layers 12,14,16 is surrounded by two optical confinement layers 10,18. These layers can e.g. be of a semiconductor identical to the second semiconductor $SC_2$ for creating the potential barrier, but another embodiment will be described relative to FIG. 4.

As will become clear hereinafter in conjunction with FIG. 5, the structure also comprises two transparent material layers, which are not visible in FIG. 2 and are perpendicular to the plane of the layers 12,14 and 16 and therefore parallel to the plane of the drawing. These layers constitute antireflection layers for the wavelength $\lambda 1$ corresponding to the energy of the forbidden band $Eg_1$ of the first semiconductor $SC_1$ constituting the shallow, narrow well $P_1$ and constituting partial reflection layers for the wavelength $\lambda 2$ corresponding to the energy of the forbidden band $Eg_3$ of the third semiconductor $SC_3$ constituting the deep, wide well $P_2$. Optical amplification then takes place at the wavelength $\lambda 1$ corresponding to the shallow, narrow well $P_1$, the laser effect taking place at the wavelength $\lambda 2$ corresponding to the deep, wide well $P_2$ due to the semireflecting mirrors surrounding said well.

The first semiconductor $SC_1$ in which is formed the narrow, shallow well $P_1$ can be of $In_xGa_{1-x}As$ with a concentration x of indium of 52% and the third semiconductor $SC_3$ in which is formed the deep, wide well $P_2$ is of InGaAs, but with a higher indium concentration of approximately 65%. These compositions correspond to the wavelengths $\lambda 1$ and $\lambda 2$ respectively of 1.5 and 1.9 microns.

The second semiconductor $SC_2$ forming the potential barrier can be of $In_{1-x}Ga_xAs_yP_{1-y}$ with x approximately 47% in order to obtain layers adapted to an InP substrate. A value of 20% can be used for y, which corresponds to a forbidden band of width 1.2 eV at 300 K, or a value of 35%, which gives a forbidden band of 1.1 eV, or a value of 50% to obtain a band of 1 eV.

With such a structure, it is possible to use 210 nm thick SiO antireflection layers. Such a layer has a reflection coefficient below $10^{-3}$ at the amplification wavelength $\lambda 1$ (1.55 microns) and 4.5% at the wavelength $\lambda 2$ (1.9 microns) of the laser effect in the dustbin well. The reflectivity difference can be increased by using a layer of thickness 630 nm, when the reflection coefficient passes to 24%. By increasing the thickness to 1.05 microns, a reflection coefficient of 30% is obtained still for a wavelength of 1.9 microns.

Multilayer compositions, e.g. of $TiO_2/SiO_2$, make it possible to maintain a reflection coefficient below $10^{-3}$ at the amplification wavelength $\lambda 1$ (1.55 microns), whilst passing the reflectivity to above 70% at the laser effect wavelength $\lambda 2$ (1.9 microns).

Figure 1A:
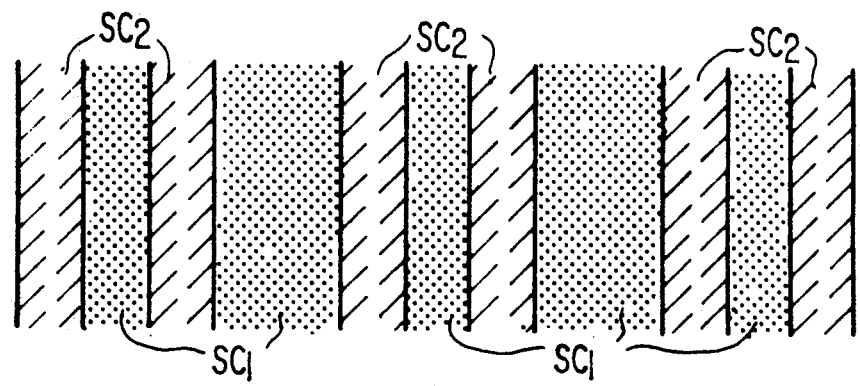
FIGS. 1a and 1b, already described, the structure of bands of a saturatable absorbent according to the prior art.
Figure 1B:
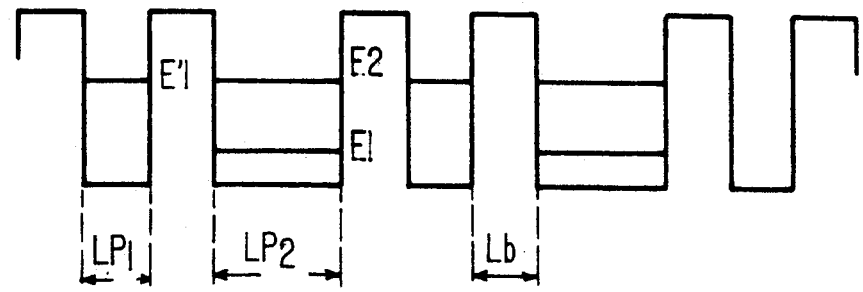
Figure 3:
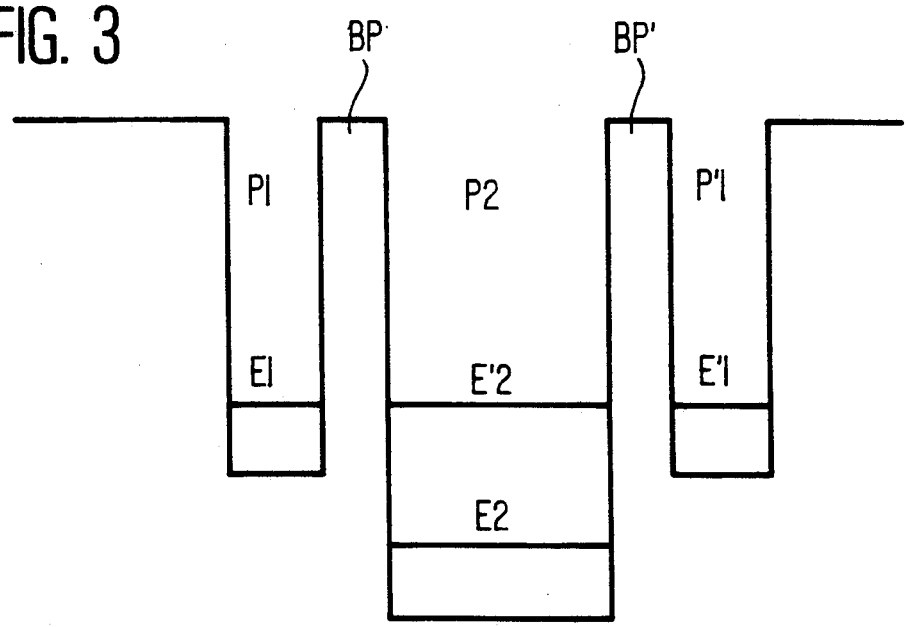
FIG. 3 a variant with two active wells surrounding a dustbin well.

FIG. 3 illustrates a variant in which a wide, deep well P2 is placed between two narrow, shallow wells P1 and P'1 with two potential barriers BP and BP'. In this variant, the state density is twice higher than in the simple case illustrated by FIG. 2. To pass even further in this direction, it is also possible to have well widths and compositions such that the level $n=2$ of the dustbin well (E'2 in FIG. 3) is in resonance with the levels $n=1$ of the two active wells E1, E'1. This leads to a state density three times that of the starting device. It is possible to obtain the indicated resonances for a complete set of parameters, e.g. the two active wells have an indium composition of 53% and a width of 5.8 nm and the dustbin well is produced with an indium composition of 65% and a width of 10 nm.

On taking for the energy reference the bottom of the conduction band of InGaAs at 65%, the following succession of levels is obtained: a level at 35 meV for the electrons $n=1$ of the dustbin well and three levels in resonance at 132 meV for the electrons $n=1$ of the two active wells and for the electrons $n=2$ of the dustbin well.

In FIGS. 2 and 3, the confinement layers 10, 18 surrounding the structure are assumed to be of a constant composition over their entire thickness. However, the scope of the invention covers the use of confinement layers with a gradual composition in the manner illustrated in FIG. 4. The latter shows a shallow, narrow well P1 and a deep, wide dustbin well P2 separated by a potential barrier BP. However, this structure is surrounded by two confinement layers 10' and 18' with a gradual composition, such that the conduction band has two valley-shaped sides. This per se known confinement type is sometimes designated by the term GRINSCH meaning "Graded Index Separate Confinement Heterostructure". This confinement type improves both the quality of the optical mode and the quality of the collection of the electrons and holes in the quantum well and therefore the speed of the device.

Finally FIG. 5 (a,b) shows the general structure of the amplifier according to the invention. As shown, the structure comprises a lower electrode 6 deposited below a substrate 8, which carries on its upper face a mesa-shaped heterostructure M with in succession and in the manner illustrated in part b), the already encountered layers namely a lower confinement layer 10, a first, narrow well 12, a barrier 14, a second, wide well 16 and finally an upper confinement layer 20. This is covered by a highly doped contact layer 20 and an upper electrode 22.

Moreover, on each of the lateral faces is provided a semireflecting layer 30 on the front face (FIG. 5, part b) and 32 on the rear face (hidden in the drawing). As explained hereinbefore, these layers simultaneously fulfil a double function, namely antireflection for the amplification wavelength and semireflection for the wavelength of the laser effect for emptying the dustbin well.

As a non-limitative example, the substrate 8 can be of n+ doped InP, the heterostructure M of InGaAsP with the compositions given hereinbefore. The lower electrode 6 can be of gold-germanium and the ohmic contact 22 of gold-zinc. The mesa structure M can be covered with an InP layer.

I claim:

1. An optical amplifier with a short switching time, characterized in that said optical amplifier comprises a stack of semiconductor layers comprising:

a first layer (12) of a first semiconductor material ($SC_1$) having a first band gap ($Eg_1$) and a first thickness ($e_1$), a second layer (14) of a second semiconductor material ($SC_2$) having a second band gap ($Eg_2$) wider than the first band gap ($Eg_1$) of the first semiconductor material, said second layer having a second thickness ($e_2$), a third layer (16) of a third semiconductor material ($SC_3$) having a third band gap ($Eg_3$) smaller than the first band gap ($Eg_1$) of the first semiconductor material ($SC_1$), said third layer (16) having a third thickness ($e_3$), said stack thus creating a shallow quantum well (P1) in the first layer (12) coupled to a deep quantum well (P2) in the third layer (16) across a potential barrier (BP) in the second layer (14), said stack also being surrounded by two layers (30, 32) constituting antireflection layers for a wavelength ($\lambda 1$) corresponding to the energy of the first band gap ($Eg_1$) of the first semiconductor material ($SC_1$) creating the shallow quantum well (P1) and partial reflection layers for a wavelength ($\lambda 2$) corresponding to the energy of the third band gap ($Eg_3$) of the third semiconductor material ($SC_3$) creating the deep quantum well (P2), wherein optical amplification occurs at the wavelength ($\lambda 1$) corresponding to the shallow well (P1) and a laser effect occurs at the wavelength ($\lambda 2$) corresponding to the deep well (P2).

2. An optical amplifier according to claim 1, characterized in that the third thickness ($e_3$) is greater than the first thickness ($e_1$).

3. An optical amplifier according to claim 1, characterized in that each stack also comprises a fourth layer identical to the second layer and a fifth layer identical to the first layer, each said stack thus incorporating a deep, wide quantum well (P2) surrounded by two shallow, narrow quantum wells (P1, P'1).

4. An optical amplifier according to claim 1, characterized in that the thickness ($e_1$) of the first layer and the thickness ($e_3$) of the third layer are such that the first energy level ($E_1$) of the shallow, narrow well (P1) is at the same height as one of the upper energy levels ($E'_2$) of the deep, narrow well (P2).

5. An optical amplifier according to claim 1, characterized in that the stack (12,14,16) is surrounded by two confinement layers (10,18).

6. An optical amplifier according to claim 5, characterized in that the two confinement layers (10',18') have gradual compositions.

7. An optical amplifier according to any one of the claims 1 to 6, characterized in that the energy of the first band gap ($Eg_1$) corresponding to the shallow, narrow well (P1) corresponds to a wavelength ($\lambda 1$) of approximately 1.5 μm.

8. An optical amplifier according to claim 7, characterized in that the first semiconductor material ($SC_1$) is of InGaAs with an In composition of approximately 52%.

9. An optical amplifier according to claim 7, characterized in that the energy of the third band gap ($Eg_2$) corresponding to the deep, wide well (P2) corresponds to a wavelength ($\lambda 2$) of approximately 1.9 μm.

10. An optical amplifier according to claim 9, characterized in that the third semiconductor material ($SC_3$) is formed of InGaAs with an In composition of approximately 65%.

* * * * *